(12) United States Patent
Kim et al.

(10) Patent No.: US 11,749,875 B2
(45) Date of Patent: Sep. 5, 2023

(54) CHIP ANTENNA AND MANUFACTURING METHOD THEREOF

(71) Applicant: Samsung Electro-Mechanics Co., Ltd., Suwon-si (KR)

(72) Inventors: Chin Mo Kim, Suwon-si (KR); Sungyong An, Suwon-si (KR); Jae Yeong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 162 days.

(21) Appl. No.: 17/343,235

(22) Filed: Jun. 9, 2021

(65) Prior Publication Data
US 2022/0216586 A1    Jul. 7, 2022

(30) Foreign Application Priority Data
Jan. 5, 2021    (KR) .................. 10-2021-0000885

(51) Int. Cl.
| | | |
|---|---|---|
| *H01Q 1/00* | (2006.01) | |
| *H01Q 1/22* | (2006.01) | |
| *H05K 1/18* | (2006.01) | |
| *H05K 3/10* | (2006.01) | |
| *H01Q 9/04* | (2006.01) | |
| *H05K 1/11* | (2006.01) | |

(52) U.S. Cl.
CPC ......... *H01Q 1/2283* (2013.01); *H01Q 9/0407* (2013.01); *H05K 1/11* (2013.01); *H05K 1/181* (2013.01); *H05K 3/10* (2013.01); *H05K 2201/10098* (2013.01)

(58) Field of Classification Search
CPC .. H01Q 1/2283; H01Q 9/0407; H01Q 9/0414; H05K 1/11; H05K 1/181; H05K 2201/10098; H05K 3/10; Y02D 30/70
See application file for complete search history.

(56) References Cited

U.S. PATENT DOCUMENTS

| | | | | |
|---|---|---|---|---|
| 5,374,937 A | * | 12/1994 | Tsunekawa | H01Q 1/244 343/702 |
| 2012/0131791 A1 | * | 5/2012 | Sanford | H01Q 1/246 29/600 |
| 2012/0208697 A1 | * | 8/2012 | Yamaguchi | G06K 19/077 156/196 |
| 2013/0070402 A1 | * | 3/2013 | Shimizu | B24C 1/10 361/679.01 |
| 2015/0042534 A1 | * | 2/2015 | Sanford | H01Q 13/02 343/834 |
| 2016/0204516 A1 | * | 7/2016 | Chung | H01Q 19/06 343/756 |
| 2017/0179577 A1 | * | 6/2017 | Sanford | H01Q 13/02 |
| 2018/0337447 A1 | * | 11/2018 | Shinojima | H01Q 17/008 |
| 2019/0196267 A1 | * | 6/2019 | Yoo | B29D 11/00326 |
| 2019/0363456 A1 | * | 11/2019 | Chen | H01Q 1/2283 |

FOREIGN PATENT DOCUMENTS

| | | |
|---|---|---|
| JP | 2005-45758 A | 2/2005 |
| JP | 5473407 B2 | 4/2014 |
| KR | 10-1508840 B1 | 4/2015 |

* cited by examiner

*Primary Examiner* — Thien M Le
(74) *Attorney, Agent, or Firm* — NSIP Law

(57) ABSTRACT

A chip antenna includes a substrate having a concavo-convex pattern on a surface thereof, and a conductor pattern disposed on the surface of the substrate having the concavo-convex pattern, wherein a convex portion extending in one direction and a concave portion extending in one direction are alternately disposed in the concavo-convex pattern.

20 Claims, 15 Drawing Sheets

CHIP ANTENNA AND MANUFACTURING METHOD THEREOF

CROSS-REFERENCE TO RELATED APPLICATIONS

This application claims the benefit under 35 USC 119(a) of Korean Patent Application No. 10-2021-0000885 filed in the Korean Intellectual Property Office on Jan. 5, 2021, the entire disclosure of which is incorporated herein by reference for all purposes.

BACKGROUND

1. Field

The present disclosure relates to a chip antenna and a manufacturing method thereof.

2. Description of the Background

A 5G communication system is realized in higher frequency (mmWave) bandwidths, for example, the bandwidths of 10 GHz to 100 GHz so as to achieve higher data rates. To reduce a propagation loss of RF signals and increase a transmission distance, beamforming, large scale multiple-input multiple-output (MIMO), full dimensional multiple-input multiple-output, an array antenna, analog beamforming, and large scale antenna schemes are being discussed in the 5G communication system field.

The current mobile communication traffic in the world is predicted to increase by an annual average of 53%, and the core industry of the fourth industrial revolution, such as the Internet of things (IoT), autonomous vehicles, virtual reality (VR), robots, and big data require a huge volume of data, so the 5G communication appears necessary.

In the earlier stages of the 5G service, a specific hotspot-based service is expected to be gradually developed into a wide area service securing mobility without limits of places and areas. In particular, regarding the wide area service securing mobility, a base station increases the using number of macro cells and small cells, and a terminal requires high-power transmission and receiving for allowing middle and long distance transmission and receiving, so a large number of array antennae are expected to be used.

However, terminal down-sizing issues will continue, so reducing the size and increasing the antenna efficiency is needed. Therefore, chip antenna modules small enough to be installed in mobile communication terminals and appropriate for the GHz bandwidth are required.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a chip antenna includes a substrate having a concavo-convex pattern on a surface thereof, and a conductor pattern disposed on the surface of the substrate having the concavo-convex pattern, wherein a convex portion extending in one direction and a concave portion extending in one direction are alternately disposed in the concavo-convex pattern.

The concavo-convex pattern may have a wave shape.

A difference in height between the convex portion and the concave portion adjacent to the convex portion may be 3 μm to 10 μm.

A height deviation of the convex portion may be less than or equal to 1 μm.

A height deviation of the concave portion may be less than or equal to 1 μm.

A distance between the convex portion and the concave portion adjacent to the convex portion may be 100 μm to 460 μm.

A surface roughness (Ra) of the substrate with the concavo-convex pattern may be greater than 0.39 μm.

The concavo-convex pattern may have waviness with a width of 1000 μm to 5000 μm and a height of 2 μm to 9 μm.

The convex or concave portion of the concavo-convex pattern may extend in a direction parallel to one edge of the substrate.

The convex or concave portion of the concavo-convex pattern may extend in a direction diagonal to one edge of the substrate.

Both surfaces or a plurality of surfaces of the substrate may have the concavo-convex pattern.

Adhesion between the substrate and the conductor pattern may be greater than 76.5 kgf.

In another general aspect, a chip antenna includes a first substrate, a second substrate disposed to face the first substrate, a first conductor pattern disposed on one surface of the first substrate and configured to operate as a feeding patch, and a second conductor pattern disposed on the second substrate and configured to operate as a radiation patch, wherein the first substrate, the second substrate, or both have a concavo-convex pattern on at least one surface thereof, and wherein a convex portion extending in one direction and a concave portion extending in one direction are alternately disposed in the concavo-convex pattern.

The convex or concave portion of the concavo-convex pattern may extend in a direction parallel to one edge of the first or second substrate.

The convex or concave portion of the concavo-convex pattern may extend in a direction diagonal to one edge of the first or second substrate.

In another general aspect, a manufacturing method of a chip antenna includes forming a concavo-convex pattern on one side of a substrate, and forming a conductor pattern on one surface of the substrate on which the concavo-convex pattern is formed, wherein a convex portion extending in one direction and a concave portion extending in one direction are alternately disposed in the concavo-convex pattern.

In the forming of the concavo-convex pattern, the concavo-convex pattern may be formed by using a wire saw.

A wire diameter of the wire saw may be 0.20 mm or less.

The forming of the conductor pattern may include applying a composition for forming a conductor pattern on one surface of the substrate on which the concavo-convex pattern is formed and then sintering the composition for forming the conductor pattern.

The composition for forming the conductor pattern may be contracted while being sintered.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
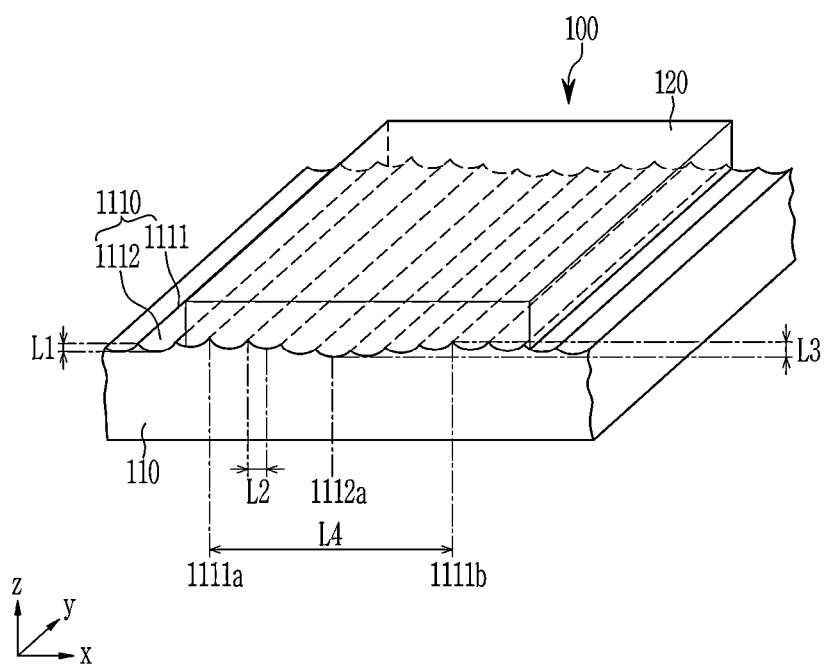
FIG. 1 illustrates a perspective view of a chip antenna according to an embodiment of the present disclosure.

Hereinafter, while example embodiments of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of functions and constructions that would be well known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Herein, it is noted that use of the term "may" with respect to an example or embodiment, for example, as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or a part of the whole element less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Spatially relative terms such as "above," "upper," "below," "lower," and the like may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

One aspect of the present disclosure is to provide a chip antenna and a manufacturing method thereof that may improve close-contacting force or adhering force between a ceramic substrate and a metal conductor pattern.

A chip antenna module described in the present specification is operable in a radio frequency region, for example, it may be operated in a frequency bandwidth of equal to or greater than 3 GHz, and for example, it may be operated in the bandwidth of 20 GHz to 60 GHz. The chip antenna module may be installed in an electronic device for receiving or transmitting RF signals. For example, the chip antenna may be installed in a portable phone, a portable laptop, or a drone.

FIG. 1 illustrates a perspective view of a chip antenna according to an embodiment.

Referring to FIG. 1, a chip antenna 100 according to the present embodiment includes a substrate 110, and a conductor pattern 120 disposed on one surface of the substrate 110.

The substrate 110 may be made of a polymer or ceramic sintered body having a predetermined dielectric constant. For example, the substrate 110 may be made of a material having a relatively high dielectric constant, such as a ceramic-based material such as a low temperature co-fired ceramic (LTCC) or a glass-based material, and it may have a higher dielectric constant or stronger durability by further containing at least one of magnesium (Mg), silicon (Si), aluminum (Al), calcium (Ca), and titanium (Ti).

The substrate 110 has a concavo-convex pattern 1110 on one surface thereof. However, the present disclosure is not limited thereto, and the substrate 110 may have concavo-convex patterns 1110 on both surfaces or on a plurality of surfaces.

The concavo-convex pattern 1110 is formed by alternately disposing a convex portion 1111 extending in one direction and a concave portion 1112 extending in one direction. Accordingly, the concavo-convex pattern 1110 may have a wavy shape as a whole.

The convex portion 1111 may be protruded upward in a thickness direction of the substrate 110, that is, in a positive z-axis direction in FIG. 1, and the concave portion 1112 may be recessed downward in the thickness direction of the substrate 110, that is, in a negative z-axis direction in FIG. 1.

The convex portion 1111 and the concave portion 1112 extend in one direction, for example, in a y-axis direction in FIG. 1. For example, the convex portion 1111 or the concave portion 1112 of the concavo-convex pattern 1110 may extend in a direction parallel to one edge of the substrate 110 or in a diagonal direction to one edge of the substrate 110. A specific example of this will be described later.

A direction in which the convex portion 1111 extends and a direction in which the concave portion 1112 extends may be substantially parallel. However, the present disclosure is not limited thereto, and an angle formed by the direction in which the convex portion 1111 extends and the direction in which the concave portion 1112 extends may be less than ±90 degrees, less than or equal to ±60 degrees, less than or equal to ±30 degrees, less than or equal to ±20 degrees, or less than or equal to ±10 degrees.

The substrate 110 may include a plurality of convex portions 1111 and a plurality of concave portions 1112 that are alternately disposed. In this case, directions in which respective convex portions 1111 extend may be substantially parallel. However, the present disclosure is not limited thereto, and an angle formed by the direction in which one convex portion 1111 extends and the direction in which another convex portion 1111 extends may be less than ±90 degrees, less than or equal to ±60 degrees, less than or equal to ±30 degrees, less than or equal to ±20 degrees, or less than or equal to ±10 degrees. In addition, directions in which respective concave portions 1112 extend may be substantially parallel. However, the present disclosure is not limited thereto, and an angle formed by the direction in which one concave portion 1112 extends and the direction in which another concave portion 1112 extends may be less than ±90 degrees, less than or equal to ±60 degrees, less than or equal to ±30 degrees, less than or equal to ±20 degrees, or less than or equal to ±10 degrees.

The convex portion 1111 may be defined as a portion having a value of greater than a mean line on one cut surface, and the concave portion 1112 may be defined as a portion having a value of smaller than the mean line in one cut surface.

Here, the cut surface may be one cut surface that intersects all of the convex portions 1111 and the concave portions 1112 to be measured, and for example, may be one of xz cut surfaces in FIG. 1. The mean line is a straight line where a sum of squares of a deviation up to an unfiltered profile is minimum, and the unfiltered profile is referred to as a contour of the concavo-convex pattern on the cut surface.

As the convex portions 1111 and the concave portions 1112 of the concavo-convex pattern 1110 are alternately disposed, a height difference L1 between the convex portion 1111 and the concave portion 1112 adjacent to the convex portion 1111 may be 3 μm (microns) to 10 μm, for example, 2 μm to 7 μm, or 4 μm to 5 μm.

The height difference L1 between the convex portion 1111 and the concave portion 1112 may be obtained from a difference between a highest height of the convex portion 1111 and a lowest height of the concave portion 1112, the highest height of the convex portion 1111 may be obtained from a largest value among distances between the unfiltered profile and the mean line that form the convex portion 1111 on one cut surface, and the lowest height of the concave portion 1112 may be obtained from a largest value among distances between the unfiltered profile and the mean line that form the concave portion 1112 on one cut surface.

When the height difference L1 between the convex portion 1111 and the concave portion 1112 is less than 3 μm, adhesion may decrease due to a decrease in anchoring effect, and when it is greater than 10 μm, horizontality may be deteriorated.

The height deviation of the convex portion 1111 may be 1 μm or less, for example, 0 μm to 0.8 μm, or 0.2 μm to 0.5 μm.

The height deviation of the convex portion 1111 may be obtained from a difference between a highest height of the convex portion 1111 on one cut surface and a highest height of the convex portion 1111 in another cut surface. Here, the two cut surfaces may be two arbitrarily selected cut surfaces, and for example, the one cut surface may be a cut surface in which roughness of the convex portion 1111 is largest, and the other cut surface may be a cut surface in which roughness of the convex portion 1111 is smallest.

When the height deviation of the convex portion 1111 is greater than 1 μm, the horizontality of the substrate may be deteriorated.

The height deviation of the concave portion 1112 may be 1 μm or less, for example, 0 μm to 0.8 μm, or 0.2 μm to 0.5 μm.

The height deviation of the concave portion 1112 may be obtained from a difference between a lowest height of the concave portion 1112 on one cut surface and a lowest height of the concave portion 1112 in another cut surface. Here, the two cut surfaces may be arbitrarily selected as two cut surfaces, and for example, the one cut surface may be a cut surface in which roughness of the concave portion 1112 is largest, and the other cut surface may be a cut surface in which roughness of the concave portion 1112 is smallest.

When the height deviation of the concave portion 1112 is greater than 1 µm, the horizontality of the substrate may be deteriorated.

A distance L2 between the convex portion 1111 and the concave portion 1112 adjacent to the convex portion 1111 may be 100 µm to 460 µm, for example, 120 µm to 450 µm, or 130 µm to 300 µm. The distance L2 between the convex portion 1111 and the concave portion 1112 may be obtained from a distance between the highest height of the convex portion 1111 and the lowest height of the concave portion 1112 on one cut surface. When the distance L2 between the convex portion 1111 and the concave portion 1112 is less than 100 µm, there may be difficulties in processing time and processing conditions, and when it is greater than 460 µm, the number of protrusions and depressions is small, so that the anchoring effect is small, and thus the adhesion may be deteriorated.

In the substrate provided with the concavo-convex pattern, a centerline surface roughness Ra may be greater than 0.39 µm, for example, 0.40 µm or more, 0.50 µm or more, 0.60 µm or more, 0.70 µm or more, or 0.77 µm or more, and may be 1.00 µm or less, for example, 0.90 µm or less, 0.80 µm or less, or 0.77 µm or less, and may be greater than 0.39 µm and 1.00 µm or less, for example, 0.50 µm to 0.90 µm, or 0.60 µm to 0.80 µm.

The centerline average roughness Ra may be calculated by Equation 1 below.

$$Ra = \frac{1}{L} \times \int_0^L |f(x)| dx \quad \text{(Equation 1)}$$

In Equation 1, L is a length measured in a predetermined direction, and f(x) is a height based on a center line of the concavo-convex pattern at a predetermined position on a surface of the substrate 110.

In other words, the center line average roughness Ra is a mean height from the centerline to the unfiltered profile, and the centerline (arithmetic mean line of profile) is parallel to the mean line and is a straight line at a position where upper and lower areas surrounded by the unfiltered profile become the same.

The concavo-convex pattern 1110 of the substrate 110 may have waviness. The waviness is a deviation from abnormal surfaces that are repeated at a greater interval and depth compared with roughness. In FIG. 1, the waviness is included between a first convex portion 1111a and a second convex portion 1111b. That is, after the first convex portion 1111a, the highest heights of the convex portions 1111 gradually decrease, and after the lowest point, the highest heights of the convex portions 1111 gradually increase, and then the highest point becomes at the second convex portion 1111b, and then the highest heights of the convex portions 1111 again gradually decrease.

A width L4 of the waviness may be 1000 µm to 5000 µm, for example, 1000 µm to 3000 µm, or 3000 µm to 5000 µm. The width L4 of the waviness is a distance between the first convex portion 1111a and the second convex portion 1111b. When the width L4 of the waviness is less than 1000 µm, the horizontal degree may be deteriorated, and when it is greater than 5000 µm, there may be difficulties in processing conditions.

A height L3 of the waviness may be 1 µm to 6 µm, for example, 1 µm to 3 µm, or 4 µm to 6 µm. The height L3 of the waviness is a height difference between a first concave portion 1112a, which has a lowest height within the width L4 of the waviness and the second convex portion 1111b. When the height L3 of the waviness is less than 1 µm, processing conditions may be difficult, and when it is greater than 6 µm, the horizontal degree may be deteriorated.

The conductor pattern 120 may be made of a conductor made of Ag, Au, Cu, Al, Pt, Ti, Mo, Ni, W, or an alloy thereof.

The conductor pattern 120 may be formed of a flat plate-shaped metal having a certain area. For example, the conductor pattern 120 may be formed in a quadrangular shape. However, the conductor pattern 120 may be formed in various shapes such as a polygonal shape and a circular shape according to embodiments.

The adhesion between the substrate 110 and the conductor pattern 120 may be greater than 76.5 kgf, for example 100 kgf to 400 kgf, 202.4 kgf to 351.4 kgf, 207.6 kgf to 351.4 kgf, 212.4 kgf to 351.4 kgf, 221.0 kgf to 351.4 kgf, 228.5 kgf to 351.4 kgf, 231.9 kgf to 351.4 kgf, 240.9 kgf to 351.4 kgf, 250.7 kgf to 351.4 kgf, 254.9 kgf to 351.4 kgf, or 279.4 kgf to 351.4 kgf.

Figure 2:
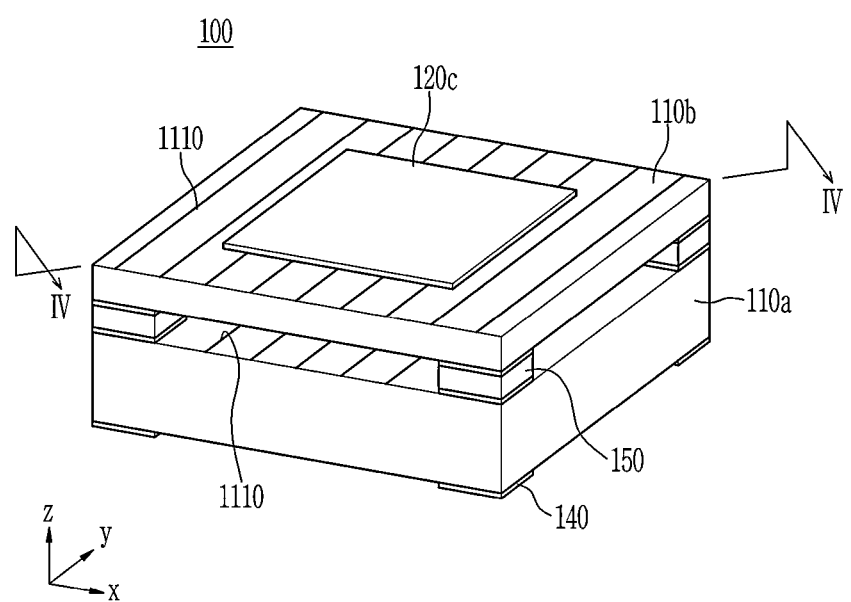
FIG. 2 illustrates a perspective view of a chip antenna according to another embodiment of the present disclosure.

Since the substrate 110 has the concavo-convex pattern 1110 on one side thereof, a contact area between the substrate 110 and the conductor pattern 120 increases, so that the adhesion between the substrate 110 and the conductor pattern 120 may be improved. In addition, the conductor pattern 120 may be manufactured by applying a metal paste and then sintering it, and in this case, the metal paste may shrink when sintering the metal paste. Therefore, the concavo-convex pattern 1110 of the substrate 110 may enhance the anchoring effect when the metal paste shrinks, thereby improving the adhesion between them. FIG. 2 illustrates a perspective view of a chip antenna according to another embodiment of the present disclosure, FIG. 3 illustrates a side view of the chip antenna of FIG. 2, and FIG. 4 illustrates a cross-sectional view of the chip antenna taken along line IV-IV of FIG. 2.

Figure 3:
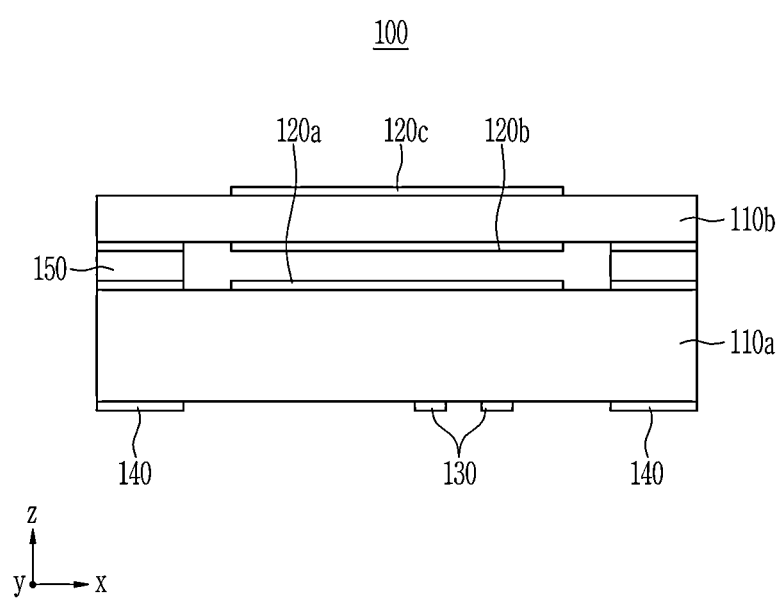
FIG. 3 illustrates a side view of the chip antenna of FIG. 2.
Figure 4:
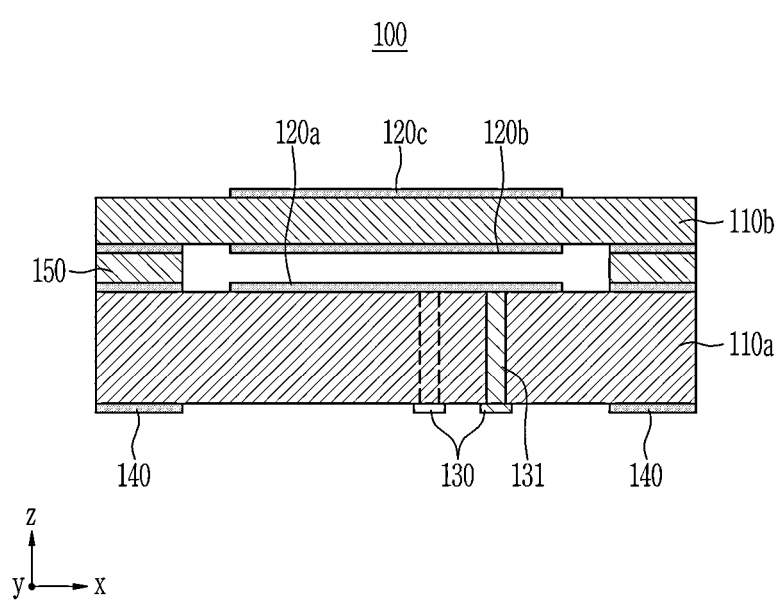
FIG. 4 illustrates a cross-sectional view of the chip antenna taken along line IV-IV of FIG. 2.

Referring to FIG. 2, FIG. 3, and FIG. 4, the chip antenna 100 may include a first substrate 110a, a second substrate 110b, and a first conductor pattern 120a, and may include at least one of a second conductor pattern 120b and a third conductor pattern 120c.

The first substrate 110a and the second substrate 110b may be disposed to be spaced apart from each other. Accordingly, a space between the first substrate 110a and the second substrate 110b may be filled with air or a medium having a dielectric constant lower than the dielectric constant of the first substrate 110a and the second substrate 110b.

The first substrate 110a, the second substrate 110b, or both may be provided with the concavo-convex pattern 1110 on at least one surface thereof. In FIG. 2, by allowing the direction in which the convex portion of the concavo-convex pattern 1110 extends to be a straight line, the concavo-convex pattern 1110 is simplified and shown. FIG. 2 illustrates that the convex portion of the concavo-convex pattern 1110 extends in a direction parallel to one edge of the first substrate 110a and the second substrate 110b, that is, the y-axis direction.

The first conductor pattern 120a is formed of a flat plate-shaped metal with a certain area. The first conductor pattern 120a is formed in a quadrangular shape. However, in some embodiments, it may be formed in various shapes such as a polygonal shape and a circular shape. The first conductor pattern 120a may be connected to a feeding via 131 to function and operate as a feed patch.

The second conductor pattern 120b and the third conductor pattern 120c are disposed to be spaced apart from the first conductor pattern 120a by a predetermined distance, and are formed of a flat plate-shaped metal having a certain area. The second conductor pattern 120b and the third conductor pattern 120c have the same area as or a different area from the first conductor pattern 120a. For example, the second conductor pattern 120b and the third conductor pattern 120c may be formed to have a smaller area than the first conductor pattern 120a to be disposed on the first conductor pattern 120a. For example, the second conductor pattern 120b and the third conductor pattern 120c may be formed to be 5% to 8% smaller than the first conductor pattern 120a. For example, thicknesses of the first conductor pattern 120a, the second conductor pattern 120b, and the third conductor pattern 120C may be 20 µm.

The second conductor pattern 120b and the third conductor pattern 120c are electromagnetically coupled to the first conductor pattern 120a, so that they may function and operate as radiation patches. The second conductor pattern 120b and the third conductor pattern 120c further concentrate an RF signal in the z-axis direction corresponding to a mounting direction of the chip antenna 100 to improve a gain or bandwidth of the first conductor pattern 120a. The chip antenna 100 may include at least one of the second conductor pattern 120b and the third conductor pattern 120c that function as a radiation patch.

Meanwhile, in some embodiments, a passivation layer formed in a form of a film along a surface of each of the first conductor pattern 120a, the second conductor pattern 120b, and the third conductor pattern 120c may be additionally formed on the first conductor pattern 120a, the second conductor pattern 120b, and the third conductor pattern 120c. The passivation layer may be formed on the surface of each of the first conductor pattern 120a, the second conductor pattern 120b, and the third conductor pattern 120c through a plating process. The passivation layer may be formed by sequentially stacking a nickel (Ni) layer and a tin (Sn) layer, or sequentially stacking a zinc (Zn) layer and a tin (Sn) layer. The passivation layer is formed on each of the first conductor pattern 120a, the second conductor pattern 120b, and the third conductor pattern 120c, so that oxidation of the first conductor pattern 120a, the second conductor pattern 120b, and the third conductor pattern 120c may be prevented. In addition, the passivation layer may be formed along surfaces of a feeding pad 130, a feeding via 131, a bonding pad 140, and a spacer 150, which will be described later.

As illustrated, the second substrate 110b may have a thickness less than that of the first substrate 110a. A thickness of the first substrate 110a may correspond to 1 to 5 times, for example, 2 to 3 times, the thickness of the second substrate 110b. For example, the thickness of the first substrate 110a may be 150 µm to 500 µm, the thickness of the second substrate 110b may be 100 µm to 200 µm, and the thickness of the second substrate 110b may be 50 µm to 200 µm. Unlike the above-described example, the second substrate 110b may have the same thickness as the first substrate 110a.

The first conductor pattern 120a is provided on one surface of the first substrate 110a, and the feeding pad 130 is provided on the other surface of the first substrate 110a opposite the one surface. At least one feeding pad 130 may be provided on the other surface of the first substrate 110a. A thickness of the feeding pad 130 may be about 20 µm.

The feeding pad 130 provided on the other surface of the first substrate 110a is electrically connected to a feeding pad provided on one surface of a substrate. The feeding pad 130 may be electrically connected to the feeding via 131 penetrating the first substrate 110a in a thickness direction, and the feeding via 131 may provide a feeding signal to the first conductor pattern 120a provided on the one surface of the first substrate 110a. At least one feeding via 131 may be provided. For example, two feeding vias 131 may be provided so as to correspond to two feeding pads 130. One of the two feeding vias 131 corresponds to a feeding line for generating vertical polarization, and the other thereof corresponds to a feeding line for generating horizontal polarization. A diameter of the feeding via 131 may be about 150 µm. The bonding pad 140 is provided on the other surface of the first substrate 110a. The bonding pad 140 allows the chip antenna 100 to be bonded to a chip antenna module substrate. A thickness of the bonding pad 140 may be about 20 µm.

Figure 5:
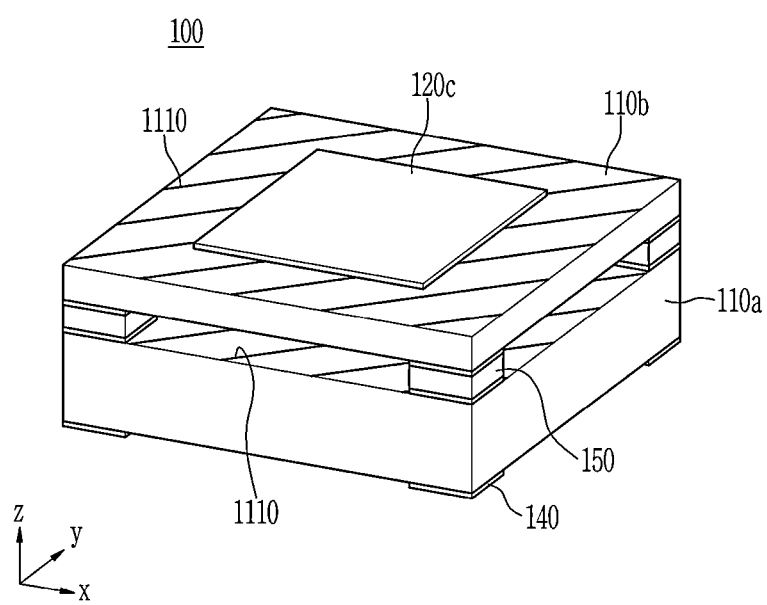
FIG. 5 illustrates a perspective view of a chip antenna according to another embodiment of the present disclosure.

FIG. 5 illustrates a perspective view of a chip antenna according to another embodiment.

Since the chip antenna according to the present embodiment is similar to the chip antenna described above, duplicate descriptions will be omitted, and differences will be mainly described.

FIG. 2 illustrates that the convex portion of the concavo-convex pattern 1110 extends in a direction parallel to one edge of the first substrate 110a and the second substrate 110b, that is, the y-axis direction, while FIG. 5 illustrates that the convex portion of the concavo-convex pattern 1110 extends diagonally to one edge of the first substrate 110a and the second substrate 110b.

Figure 6:
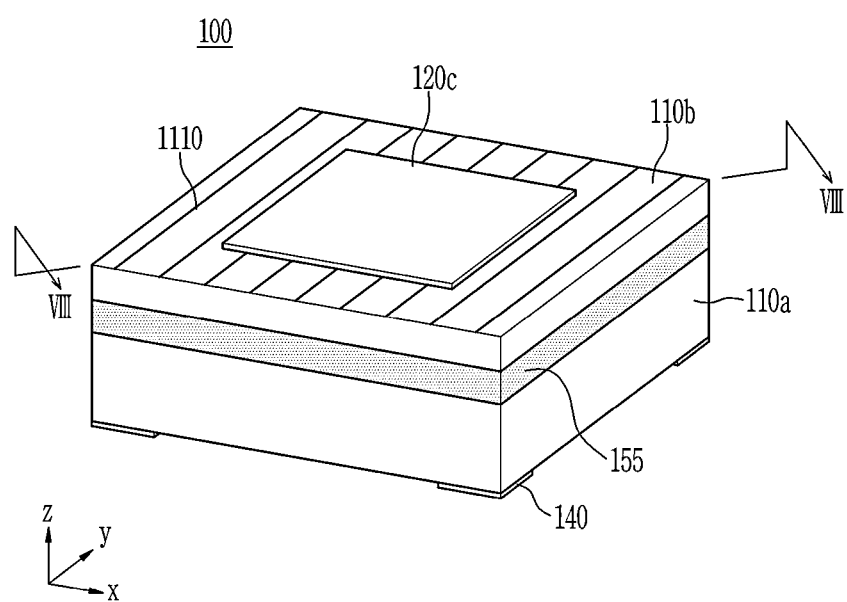
FIG. 6 illustrates a perspective view of a chip antenna according to another embodiment of the present disclosure.
Figure 7:
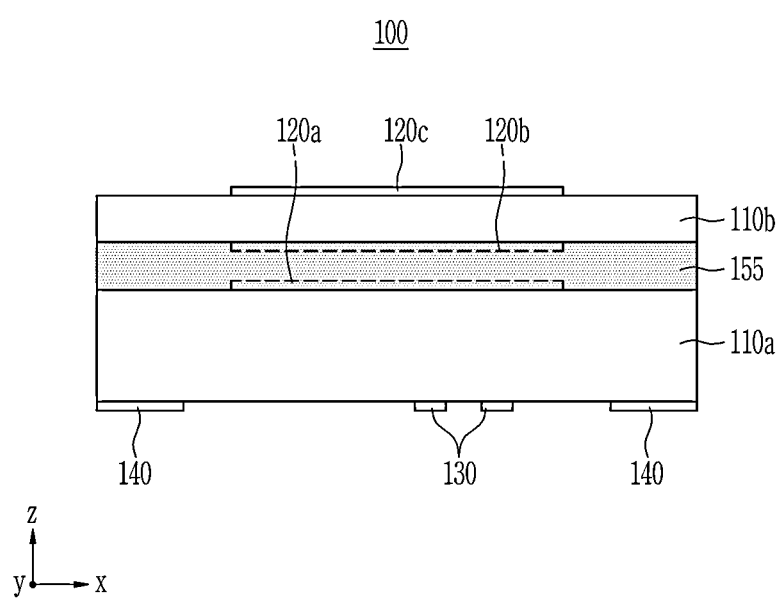
FIG. 7 illustrates a side view of the chip antenna of FIG. 6.
Figure 8:
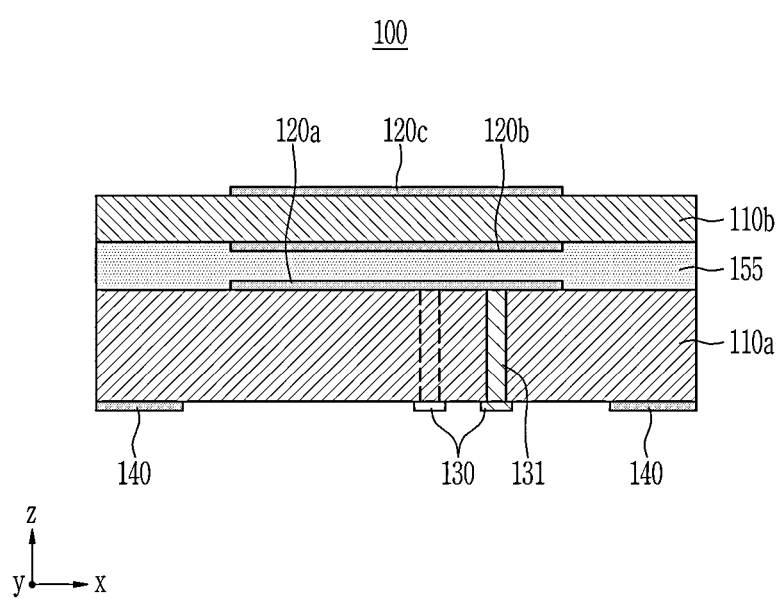
FIG. 8 illustrates a cross-sectional view of the chip antenna taken along line VIII-VIII of FIG. 6.

FIG. 6 illustrates a perspective view of a chip antenna according to another embodiment of the present disclosure, FIG. 7 illustrates a side view of the chip antenna of FIG. 6, and FIG. 8 illustrates a cross-sectional view of the chip antenna taken along line VIII-VIII of FIG. 6.

Since the chip antenna according to the present embodiment is similar to the chip antenna described above, duplicate descriptions will be omitted, and differences will be mainly described.

FIG. 2 illustrates that the first substrate 110a and the second substrate 110b of the chip antenna 100 are disposed to be separated from each other through the spacer 150, while FIG. 6 illustrates that the first substrate 110a and the second substrate 110b of the chip antenna 100 are mutually bonded through a bonding layer 155. In FIG. 6, it may be understood that the bonding layer 155 is provided in a space formed by a gap between the first substrate 110a and the second substrate 110b of FIG. 2.

The bonding layer 155 may be formed to cover one surface of the first substrate 110a and the other surface of the second substrate 110b, facing the one surface of the first substrate 110a, to entirely bond the first substrate 110a and the second substrate 110b. The bonding layer 155 may be formed of, for example, a polymer, and for example, the polymer may include a polymer sheet. A dielectric constant of the bonding layer 155 may be lower than that of the first substrate 110a and the second substrate 110b. For example, the dielectric constant of the bonding layer 155 may be a dielectric constant at 28 GHz, and a thickness of the bonding layer 155 may be 50 μm to 200 μm.

Figure 9:
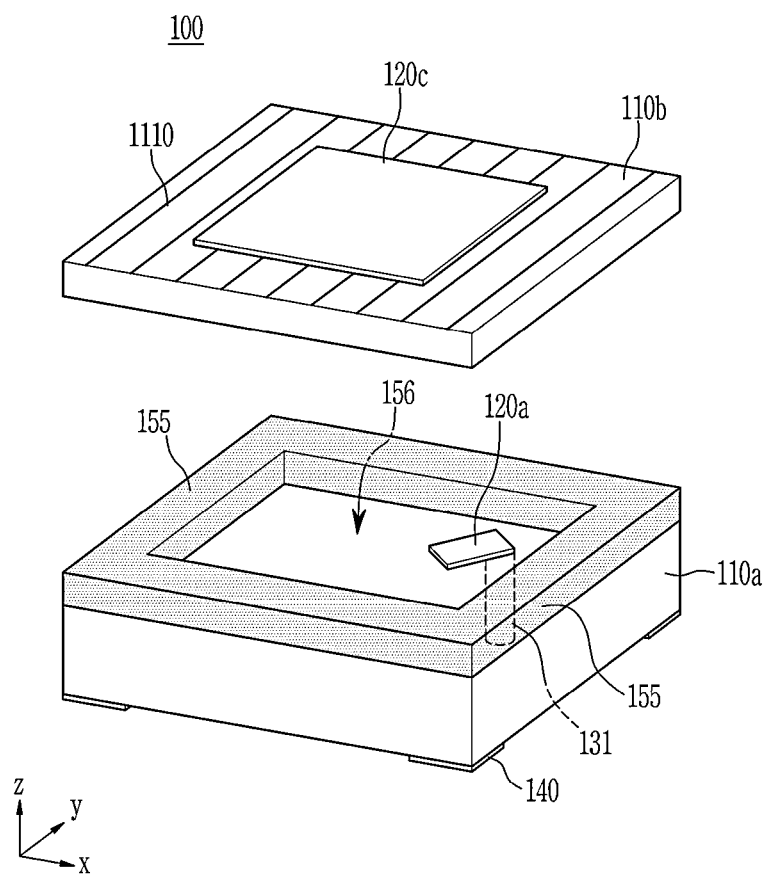
FIG. 9 illustrates a partial exploded perspective view of a chip antenna according to another embodiment of the present disclosure.
Figure 10:
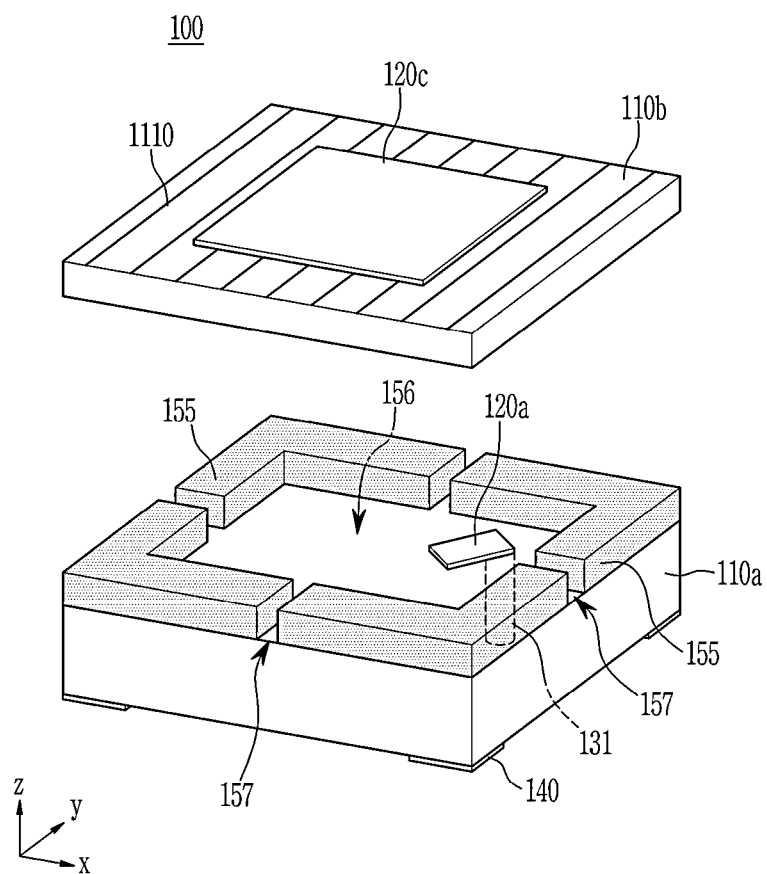
FIG. 10 illustrates a partial exploded perspective view of a chip antenna according to another embodiment of the present disclosure.

FIG. 9 and FIG. 10 illustrate partial exploded perspective views of a chip antenna according to another embodiment.

Since the chip antenna according to the present embodiments is similar to the chip antenna described above, duplicate descriptions will be omitted, and differences will be mainly described.

In the embodiment shown in FIG. 6, the bonding layer 155 is formed to cover the entire surface of the first substrate 110a to entirely bond the first substrate 110a and the second substrate 110b, while in the embodiments shown in FIG. 9 and FIG. 10, the bonding layer 155 may have a cavity 156 to surround the first conductor pattern 120a, and the cavity 156 may provide a dielectric medium (for example, air) that is lower than the dielectric constant of the bonding layer 155, so that a bandwidth and gain may be further improved compared with a size of the chip antenna 100.

Since a dimension or shape of the cavity 156 may affect a resonance frequency or performance of the chip antenna 100, the chip antenna 100 has a structure that reduces a phenomenon that the dimension or shape of the cavity 156 deviates from a designed dimension or shape during the manufacturing process, so that more stable performance thereof may be realized.

In addition, since the bonding layer 155 may have a shorter width as the cavity 156 is provided, the bonding layer 155 may have relatively weak structural stability compared with a case in which the cavity 156 is not provided. Therefore, the chip antenna 100 has a structure that reduces factors that physically affect the bonding layer 155 during the manufacturing process, so that more stable performance may be realized.

Accordingly, as in the embodiment shown in FIG. 10, the bonding layer 155 may have a ventilation channel 157 between the cavity 156 and an outer surface of the bonding layer 155.

For example, in the manufacturing process of the chip antenna 100, when the first substrate 110a and the second substrate 110b are bonded by the bonding layer 155, the chip antenna 100 may be subjected to stress that causes a volume change of the cavity 156, and this stress may distort the dimension or shape of the cavity 156 or cause cracks in the first and second substrates 110a and 110b.

The ventilation channel 157 provides an air movement path of the cavity 156 when the chip antenna 100 is subjected to the stress that causes the volume change of the cavity 156, thereby reducing the influence of the stress on the chip antenna 100.

Accordingly, the chip antenna 100 may reduce a phenomenon in which the dimension or shape of the cavity 156 deviates from the designed dimension or shape during the manufacturing process, or factors that physically affect the bonding layer 155, so that the performance (bandwidth and gain versus size) that is improved based on the cavity 156 may be more stably obtained.

For example, the bonding layer 155 may include a polymer having higher adhesion than the dielectric material of the first substrate 110a and the second substrate 110b. Since the adhesive polymer may have a fluid characteristic compared with a ceramic structure, although the dimension or shape of the cavity 156 may have an instability factor, since the chip antenna 100 includes the ventilation channel 157, the cavity 156 of the bonding layer 155 including the adhesive polymer having the fluid characteristic may be stably provided.

For example, one outer side surface of the bonding layer 155, one side surface of the first substrate 110a, and one side surface of the second substrate 110b may form one plane. That is, the chip antenna 100 may have a shape in which the side surfaces of the structure are cut in a structure in which the bonding layer 155 is adhered to the first substrate 110a and the second substrate 110b.

Accordingly, the ventilation channel 157 may be more stably formed, and the air movement path of the cavity 156 may be more stably provided. In addition, when a plurality of chip antennas 100 are manufactured together, the ventilation channel 157 may also serve as an air movement path between respective cavities 156 of the plurality of chip antennas 100.

For example, a width of the ventilation channel 157 may be shorter than a length of a structure surrounding the cavity 156 in the bonding layer 155, and may be shorter than a width thereof. Accordingly, since leakage of an RF signal in the horizontal direction may be further suppressed, the gain of the chip antenna 100 may be further improved.

For example, the ventilation channel 157 is configured in plural, and the plurality of ventilation channels 157 may be positioned to overlap each other in a ventilation direction (for example, the x-axis direction and/or y-axis direction) of the plurality of ventilation channels 157.

Accordingly, air movement efficiency with respect to the width of the plurality of ventilation channels 157 may be further improved, so that the chip antenna 100 may stably obtain a high gain. In addition, the overlapping structure of the plurality of ventilation channels 157 may be more efficiently formed when a plurality of chip antennas 100 are manufactured together.

Figure 11:
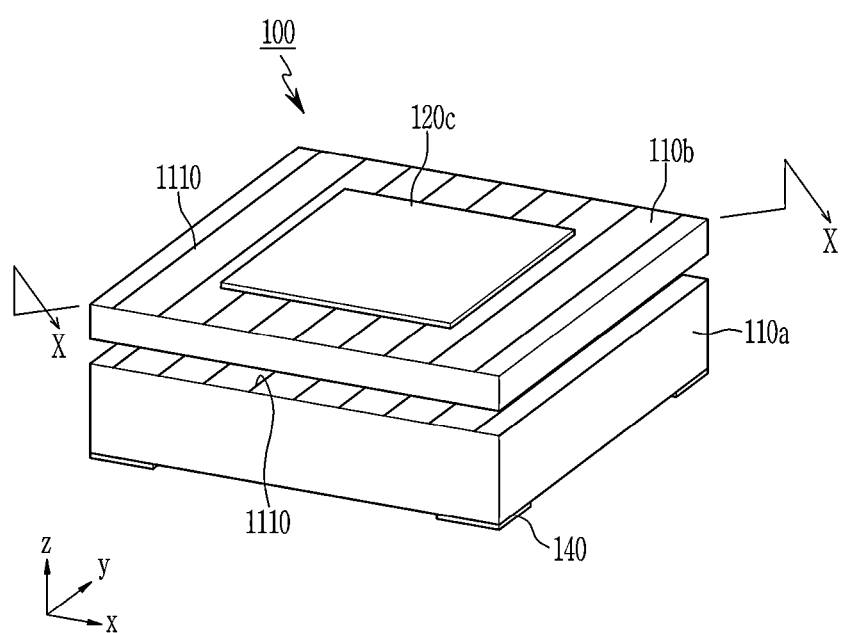
FIG. 11 illustrates a perspective view of a chip antenna according to another embodiment of the present disclosure.
Figure 12:
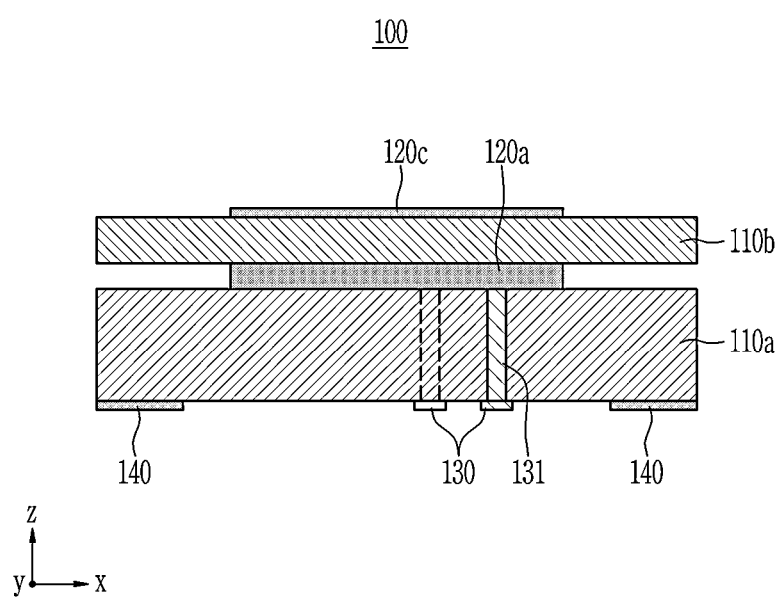
FIG. 12 illustrates a cross-sectional view of the chip antenna taken along line X-X of FIG.

FIG. 11 illustrates a perspective view of a chip antenna according to another embodiment, and FIG. 12 illustrates a cross-sectional view of the chip antenna taken along line X-X of FIG. 11.

Since the chip antenna according to the present embodiment is similar to the chip antenna described above, duplicate descriptions will be omitted, and differences will be mainly described.

In FIG. 2, the first substrate 110a and the second substrate 110b of the chip antenna 100 are disposed to be separated from each other through the spacer 150, while in FIG. 11, the first substrate 110a and the second substrate 110b of the chip antenna 100 may be mutually bonded with the first conductor pattern 120a therebetween.

Specifically, the first conductor pattern 120a is provided on one surface of the first substrate 110a, and the second conductor pattern 120b is provided on one surface of the second substrate 110b. The first conductor pattern 120a provided on one surface of the first substrate 110a may be bonded to the other surface of the second substrate 110b opposite the one surface of the second substrate 110b. Accordingly, the first conductor pattern 120a may be interposed between the first substrate 110a and the second substrate 110b.

Figure 13:
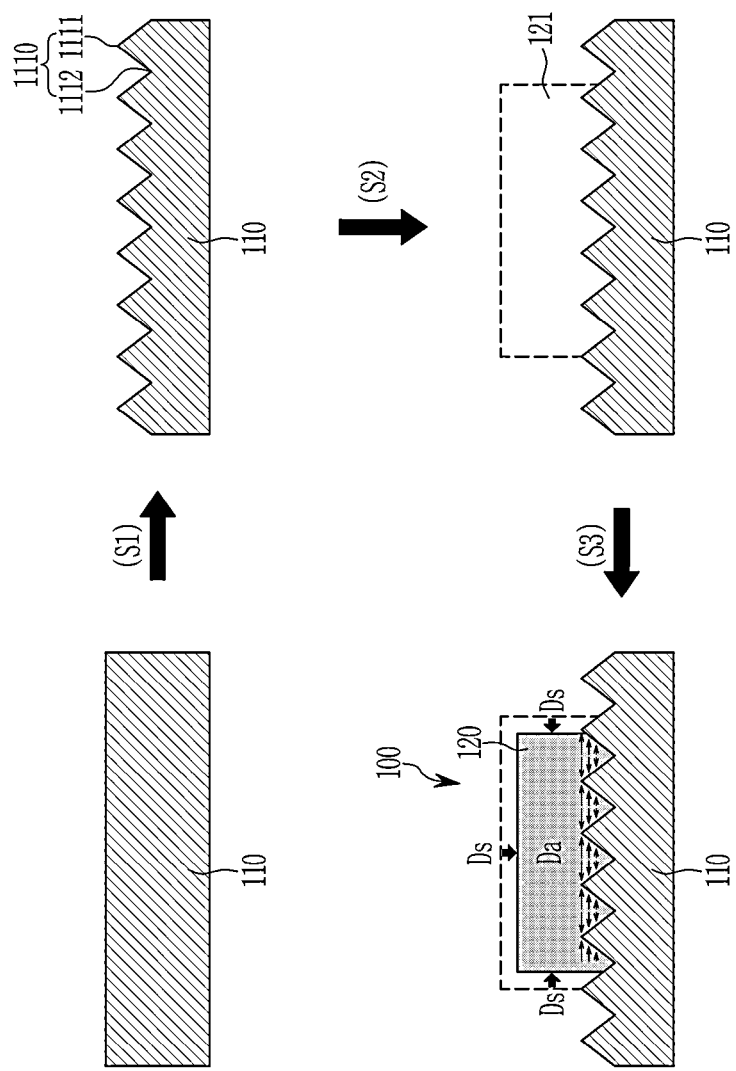
FIG. 13 illustrates a manufacturing process diagram of a manufacturing method of a chip antenna according to another embodiment of the present disclosure.

FIG. 13 illustrates a manufacturing process diagram of a manufacturing method of a chip antenna according to another embodiment.

Referring to FIG. 13, the manufacturing method of the chip antenna 100 includes forming the concavo-convex pattern 1110 on one surface of the substrate 110 (51), and forming the conductor pattern 120 on one surface of the substrate 110 on which the concavo-convex pattern 1110 is formed (S2 and S3).

First, the concavo-convex pattern 1110 is formed on one surface of the substrate 110 (51).

The concavo-convex pattern 1110 may be formed so that the convex portion 1111 extending in one direction and the concave portion 1112 extending in one direction are alternately disposed. The concavo-convex pattern 1110 may be formed by using, for example, a wire saw. As an example, the wire saw may use a wire with adsorbed diamonds.

Specifically, when, while passing through a wire that is reciprocated between a pair of drums, the substrate 110 is cut by the wire, and the convex portion 1111 and the concave portion 1112 extending in the direction in which the wire is reciprocated are formed, so that the concavo-convex pattern 1110 in which the convex portions 1111 and the concave portions 1112 are alternately disposed in the direction in which the substrate 110 passes through the wire may be formed.

In this case, the shape of the concavo-convex pattern 1110, and the height difference and distance between the convex portion 1111 and the concave portion 1112 may be adjusted by using the diameter and reciprocating speed of the wire, the passing speed of the substrate 110, or the tension of the wire. In addition, the waviness may be formed by eccentricity or vibration of the wire saw.

As an example, the diameter of the wire may be 0.20 mm or less, for example 0.18 mm or less, 0.17 mm or less, 0.16 mm or less, 0.15 mm or less, 0.14 mm or less, 0.13 mm or less, 0.12 mm or less, 0.11 mm or less, 0.10 mm or less, 0.09 mm or less, 0.08 mm or less, or may be 0.08 mm to 0.20 mm.

Next, a composition 121 for forming the conductor pattern is applied on the surface of the substrate 110 on which the concavo-convex pattern 1110 is formed (S2).

The composition 121 for forming the conductor pattern may be, for example, a metal paste, and the metal may be Ag, Au, Cu, Al, Pt, Ti, Mo, Ni, W, or an alloy thereof. By using the metal paste, the conductor pattern 120 may be directly formed into the designed shape without a separate etching process.

The method of applying the composition 121 for forming the conductor pattern on the one surface of the substrate 110 on which the concavo-convex pattern 1110 is formed is not particularly limited in the present disclosure, and for example, a spin coating, bar coating, spray coating, slit coating, screen printing, inkjet printing, nozzle printing, spraying, or doctor blade coating method may be used.

Finally, the composition 121 for forming the conductor pattern is sintered to form the conductor pattern 120 (S3).

A sintering temperature of the composition 121 for forming the conductor pattern may be 500° C. to 1000° C., and a sintering time thereof may be 1 minute to 10 hours.

When the sintering temperature of the composition 121 for forming the conductor pattern is less than 500° C., or when the sintering time thereof is less than 1 minute, the composition may be unsintered so that the adhesion may be deteriorated, and when the sintering temperature thereof is greater than 1000° C., or when the sintering time thereof is greater than 10 hours, the composition may be over-sintered, so that an electrode peeling phenomenon may occur.

In this case, the composition 121 for forming the conductor pattern may shrink by about 13 vol % to 20 vol % in direction Ds while being sintered. The concavo-convex pattern 1110 of the substrate 110 enhances the anchoring effect Da when the composition 121 for forming the conductor pattern is contracted, thereby improving the bonding strength between the substrate 110 and the conductor pattern 120.

Hereinafter, specific embodiments of the present disclosure are described. However, the following described examples are only for illustrating the disclosure more specifically, and thus the scope of the disclosure should not be limited by these examples.

Preparation Example: Preparation of Chip Antenna

Preparation Example 1

A ceramic sintered substrate (with a size of 5 mm in width and 5 mm in length and a thickness of 50 mm) including a $Mg_2SiO_4$ phase, a $MgAl_2O_4$ phase, and a $CaTiO_3$ phase was cut by using a wire saw with a diameter of 0.08 mm under a condition of Ra 5 μm to form a concavo-convex pattern on one surface thereof.

A metal paste containing Ag, Pd, glass frit, and an inorganic solvent was prepared, and the metal paste was applied on the one surface of the substrate on which the concavo-convex pattern was formed, and then the metal paste was sintered to prepare a chip antenna. In this case, the metal paste is contracted by about 18 vol %.

Preparation Example 2 to Preparation Example 12

A chip antenna was prepared in the same manner as in Preparation Example 1, except that the substrate of Preparation Example 1 was cut by using wire saws having diameters of 0.09 mm, 0.11 mm, 0.10 mm, 0.12 mm, 0.13 mm, 0.14 mm, 0.15 mm, 0.16 mm, 0.17 mm, 0.18 mm, and 0.20 mm, respectively.

Comparative Preparation Example 1

A chip antenna was prepared in the same manner as in Preparation Example 1, except that a substrate was cut under the condition of a roughness Ra of 0.5 μm by lapping without using a wire saw.

Experimental Example 1: Analysis of Concavo-Convex Pattern of Substrate

The surfaces of the substrate prepared in Preparation Example 1 and the substrate prepared in Comparative Preparation Example 1 were analyzed under conditions of 10 to 30 times magnification by using a 3D measuring laser microscope (Manufacturer: OLYMPUS, product name: OLS4000) using reflection of a laser beam, and the results are shown in FIG. 14 and FIG. 15, respectively.

Figure 14:
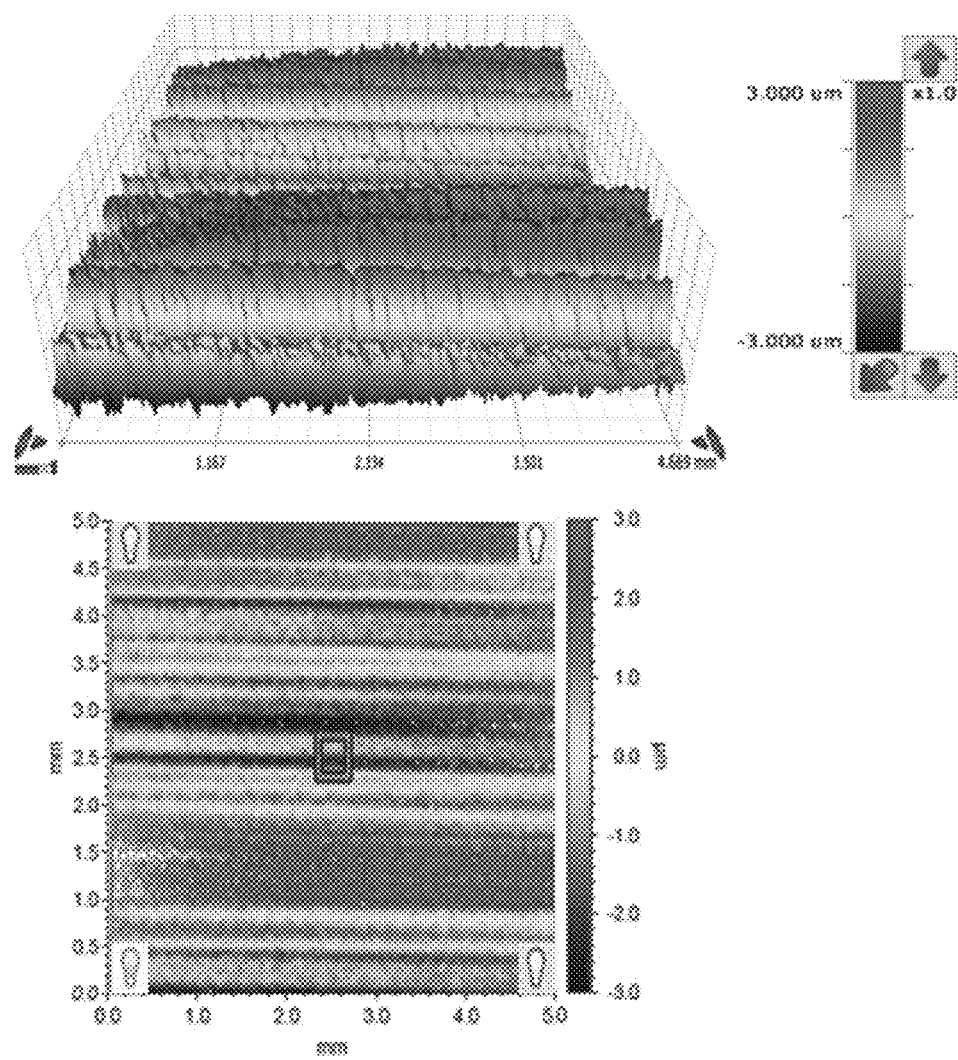
FIG. 14 illustrates a graph of results of analyzing a surficial concavo-convex pattern of a substrate prepared in Preparation Example 1.
Figure 15:
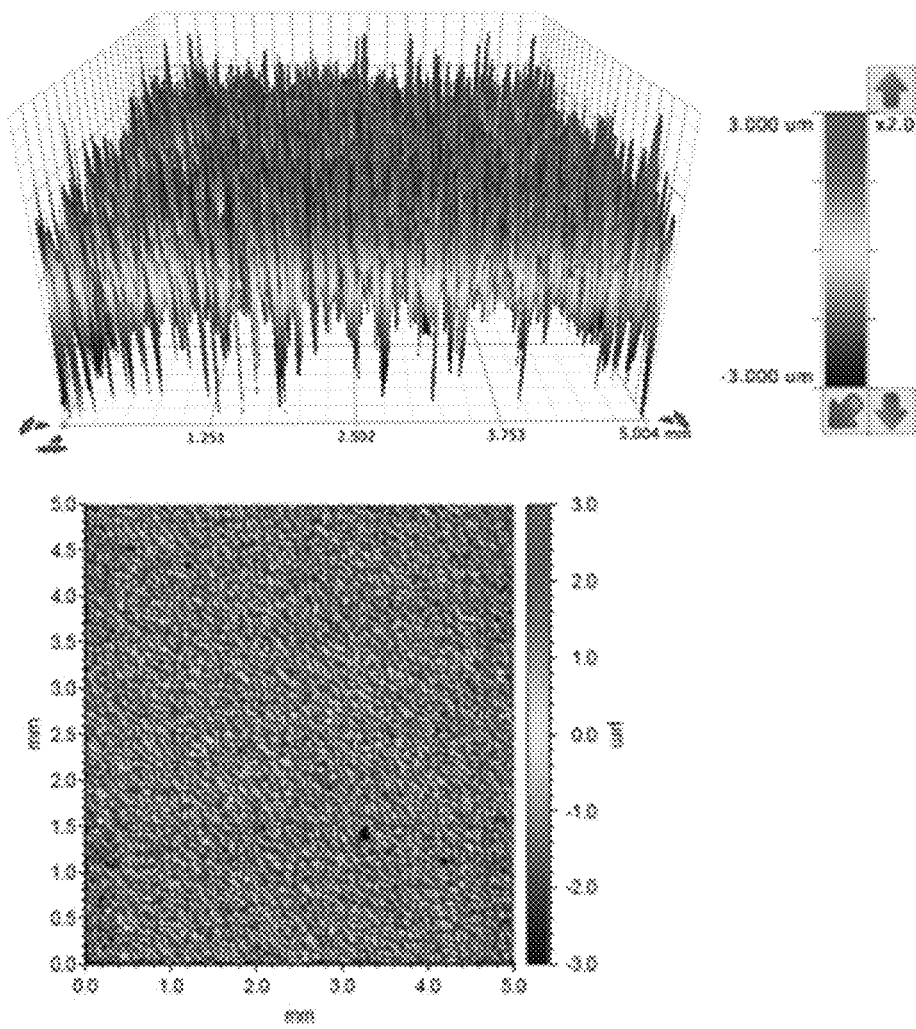
FIG. 15 illustrates a graph of results of analyzing a surficial concavo-convex pattern of a substrate prepared in Comparative Preparation Example 1.

Referring to FIG. 14 and FIG. 15, it can be confirmed that in the case of the substrate prepared in Preparation Example 1, the concavo-convex pattern in which the convex portion extending in one direction and the concave portion extending in one direction were alternately disposed was formed (Ra=0.77 μm, Rz=4.3 μm), while in the case of the substrate prepared in Comparative Preparation Example 1, a random surface roughness was obtained (Ra=0.39 μm, Rz=4.2 μm).

Experimental Example 2: Measurement of Adhesion of Substrate

The height difference between the convex portion and the concave portion adjacent to the convex portion, and the distance between the convex portion and the concave portion adjacent to the convex portion of the substrate prepared in Preparation Examples 1 to 12, and the substrate prepared in Comparative Preparation Example 1 were measured, and the results are summarized in Table 1.

In this case, the height difference between the convex portion and the concave portion adjacent to the convex portion, and the distance between the convex portion and the concave portion adjacent to the convex portion, were measured by a non-contact method under the condition of 30 times magnification by using a 3D laser microscope using a laser beam.

In addition, the adhesion between the substrate and the conductor pattern of the chip antenna prepared in Preparation Examples 1 to 12 and Comparative Preparation Example 1 was measured by a contact method under the condition of a speed of 500 μm/s and 5 kgf of a load cell by using a 30 μm-thick gauge pin of Dage4000plus (Manufacturer: NORDSON), and the results are also summarized in Table 1.

TABLE 1

| | Wire diameter (mm) | Distance between convex portion and concave portion (μm) | Height difference between convex portion and concave portion (μm) | Adhesion (kgf) | Adhesion increase rate (%) |
|---|---|---|---|---|---|
| Preparation Example 1 | 0.08 | 145 | 3 | 351.4 | 459 |
| Preparation Example 2 | 0.09 | 225 | 4 | 279.4 | 365 |
| Preparation Example 3 | 0.10 | 250 | 4 | 240.9 | 315 |
| Preparation Example 4 | 0.11 | 275 | 4 | 212.4 | 278 |
| Preparation Example 5 | 0.12 | 300 | 5 | 254.9 | 333 |
| Preparation Example 6 | 0.13 | 325 | 5 | 228.5 | 299 |
| Preparation Example 7 | 0.14 | 350 | 5 | 207.6 | 271 |
| Preparation Example 8 | 0.15 | 375 | 6 | 240.9 | 315 |
| Preparation Example 9 | 0.16 | 400 | 6 | 221.0 | 289 |
| Preparation Example 10 | 0.17 | 425 | 7 | 250.7 | 328 |
| Preparation Example 11 | 0.18 | 450 | 7 | 231.9 | 303 |
| Preparation Example 12 | 0.20 | 500 | 7 | 202.4 | 265 |
| Comparative Preparation Example 1 | — | — | 4[1] | 76.5 | 100 |

[1]In the case of Comparative Preparation Example 1, the difference in height between the convex portion and the concave portion was measured to have a 10-point average roughness (Rz).

Referring to Table 1, it can be confirmed that since the chip antennas prepared in Preparation Example 1 to Preparation Example 12 included the concavo-convex pattern formed on the substrate surface, the adhesion between the substrate and the conductor pattern was excellent compared with the chip antenna prepared in Comparative Preparation Example 1.

According to the chip antenna and the manufacturing method thereof as described in the embodiments herein, it is possible to improve close-contacting force or adhering force between a ceramic substrate and a metal conductor pattern by increasing a surface area of the ceramic substrate, and to improve bonding force between them by reinforcing an anchoring effect by a shrinkage behavior during sintering of the metal conductor pattern.

While specific example embodiments have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A chip antenna comprising:
    a substrate comprising a concavo-convex pattern on a surface thereof; and
    a conductor pattern disposed on the surface of the substrate comprising the concavo-convex pattern,
    wherein a convex portion extending in one direction and a concave portion extending in one direction are alternately disposed in the concavo-convex pattern.

2. The chip antenna of claim 1, wherein
    the concavo-convex pattern has a wave shape.

3. The chip antenna of claim 1, wherein
    a difference in height between the convex portion and the concave portion adjacent to the convex portion is 3 μm to 10 μm.

4. The chip antenna of claim 1, wherein
    a height deviation of the convex portion is less than or equal to 1 μm.

5. The chip antenna of claim 1, wherein
a height deviation of the concave portion is less than or equal to 1 μm.

6. The chip antenna of claim 1, wherein
a distance between the convex portion and the concave portion adjacent to the convex portion is 100 μm to 460 μm.

7. The chip antenna of claim 1, wherein
a surface roughness (Ra) of the substrate with the concavo-convex pattern is greater than 0.39 μm.

8. The chip antenna of claim 1, wherein
the concavo-convex pattern has waviness with a width of 1000 μm to 5000 μm and a height of 2 μm to 9 μm.

9. The chip antenna of claim 1, wherein
the convex or concave portion of the concavo-convex pattern extends in a direction parallel to one edge of the substrate.

10. The chip antenna of claim 1, wherein
the convex or concave portion of the concavo-convex pattern extends in a direction diagonal to one edge of the substrate.

11. The chip antenna of claim 1, wherein
both surfaces or a plurality of surfaces of the substrate comprise the concavo-convex pattern.

12. The chip antenna of claim 1, wherein
adhesion between the substrate and the conductor pattern is greater than 76.5 kgf.

13. A chip antenna comprising:
a first substrate;
a second substrate disposed to face the first substrate;
a first conductor pattern disposed on one surface of the first substrate and configured to operate as a feeding patch; and
a second conductor pattern disposed on the second substrate and configured to operate as a radiation patch,
wherein the first substrate, the second substrate, or both have a concavo-convex pattern on at least one surface thereof, and
wherein a convex portion extending in one direction and a concave portion extending in one direction are alternately disposed in the concavo-convex pattern.

14. The chip antenna of claim 13, wherein
the convex or concave portion of the concavo-convex pattern extends in a direction parallel to one edge of the first or second substrate.

15. The chip antenna of claim 13, wherein
the convex or concave portion of the concavo-convex pattern extends in a direction diagonal to one edge of the first or second substrate.

16. A manufacturing method of a chip antenna, comprising:
forming a concavo-convex pattern on one side of a substrate; and
forming a conductor pattern on one surface of the substrate on which the concavo-convex pattern is formed,
wherein a convex portion extending in one direction and a concave portion extending in one direction are alternately disposed in the concavo-convex pattern.

17. The manufacturing method of the chip antenna of claim 16, wherein
in the forming of the concavo-convex pattern, the concavo-convex pattern is formed by using a wire saw.

18. The manufacturing method of the chip antenna of claim 17, wherein
a wire diameter of the wire saw is 0.20 mm or less.

19. The manufacturing method of the chip antenna of claim 16, wherein
the forming of the conductor pattern includes applying a composition for forming a conductor pattern on one surface of the substrate on which the concavo-convex pattern is formed and then sintering the composition for forming the conductor pattern.

20. The manufacturing method of the chip antenna of claim 19, wherein
the composition for forming the conductor pattern is contracted while being sintered.

* * * * *